RADIATION RESISTANT SEMICONDUCTOR DEVICE AND METHOD

Filed June 29, 1964

INVENTOR.
Brian David James
BY
Flehr and Swain
Attorneys

1

3,518,494

RADIATION RESISTANT SEMICONDUCTOR DEVICE AND METHOD

Brian David James, Menlo Park, Calif., assignor to Signetics Corporation, Sunnyvale, Calif., a corporation of California Filed June 29, 1964, Ser. No. 378,829
Int. Cl. H01l 1/14, 3/17
U.S. Cl. 317—101 14 Claims This invention relates to a radiation resistant semiconductor device and method and more particularly to a structure and method for rendering a semiconductor device resistant to ionization caused by radiation.

At the present time, it is well known that semiconductor devices degrade in a radiation field. It is also known that one form of degradation is due to surface deterioration of the semiconductor device. It has been found that this surface deterioration takes place in a radiating field which will ionize the gas environment in which the semiconductor device is encapsulated. When subjected to radiation, the gas environment will be ionized into positive ions and eelctrons. These positive ions and electrons will move in any electrical field that exists inside the encapsulated ion of the semiconductor device. Thus, for example, when the semiconductor device has a reverse bias p-n junction as, for example, in a p-n diode, the positive ions will move towards the p-type area of the diode under the influence of the fringing fields at the junction between the p- and n-type regions of the diode where the junction intercepts the surface. In planar type semiconductor devices in which an oxide is very often formed over the top surface of the planar devices, the positive ions will accumulate over the oxide and will be held there by the fringing field. The accumulation of positive ions on one side of the oxide layer in the planar device will cause electrons to be attracted on the opposite side of the oxide, i.e., at the silicon surface of the semiconductor device, assuming that the semiconductor device is formed from silicon. As these electrons accumulate on the surface of the device, they can eventually reach a sufficiently high concentration to overcompensate the p-type nature of the p-type region of the diode and will change it to n-type material. This condition has become known as the formation of a surface inversion layer. This means that the area of the junction in the p-n diode is greatly increased which, in turn, causes a great increase in the leakage of the junction to cause great deterioration in the useful function of the semiconductor device. In fact, the leakage can become so severe that the device is no longer useful for the purpose for which it was originally intended. In the case of mesa type devices, the positive ions accumulate directly onto the silicon surface causing even more severe deterioration.

The extent and degree of degradation depends upon the total dosage of radiation and, in addition, the dosage rate. The dosage rate affects the degradation because, over a period of time, some of the positive ions which moved into contact with the semiconductor device will gradually leak off.

The formation of the inversion layer on the surface of a diode causes an increase in leakage current. However, in a transistor, the inversion layer can unite the collector to the emitter by the formation of an n-type inversion layer over the surface of a p-type base of a transistor causing an emitter-collector short and complete failure of the device. In the case of integrated circuitry as, for example, where there are several n-type islands disposed in a p-type region, the p-type region separating the islands can have an n-type inversion layer formed on its surface and thereby short out the devices and the separately isolated n-type regions of the integrated circuit. This would cause complete failure of the integrated circuit. The same

2 effect can occur in devices of reverse polarity in which p-type islands are disposed in an n-type region. This mode of failure in integrated circuits is in addition to the failure modes for individual devices as set forth above.

It should be pointed out that at the same time the positive ions are attracted to the p-type regions of the reverse bias junctions, the eelctrons are also attracted to the n-type regions of the reverse bias junctions and over a period of time can cause the formation of a complementary inversion layer, this being a p-type inversion layer over an n-type region. Thus, it can be seen that the formation of the inversion layer is symmetrical and can be of either sign.

When the semiconductor device is encapsulated in a metal can as, for example, in a TO–5 package conventionally used and the metal can is grounded, then an electric field is set up between the walls of the can and the device itself along which the electrons and positive ions will drift to accelerate the formation of the inversion layers hereinbefore described. Thus, where a semiconductor device is encapsulated in a can, two electric fields are created; one is the fringing field hereinbefore described and the other is the field formed between the semiconductor device and the can. Both of the fields cooperate to accelerate the formation of the inversion layers hereinbefore described. There is, therefore, a need for a semiconductor device which is resistant to ionization caused by radiation.

In general, it is an object of the invention to provide a semiconductor device which is resistant to ionization caused by radiation.

Another object of the invention is to provide a semiconductor device which can be readily and inexpensively fabricated.

Another object of the invention is to provide a method for fabricating a semiconductor device which is resistant to ionization caused by radiation.

Another object of the invention is to protect the surface of the semiconductor device from deterioration such as may be caused by chemical attack in a hostile chemical environment.

Additional objects and features of the invention will appear from the following description in which the preferred embodiments are set forth in conjunction with the accompanying drawings.

Referring to the drawings.

In general, my semiconductor device which is resistant to ionization caused by radiation consists of a semiconductor body having a surface. The body contains a region of one conductivity type. A region of opposite conductivity type is disposed in said region of one conductivity type and forms a junction which extends to the surface of the body. Contact means is secured to at least one of the regions. A layer of dielectric material is disposed over the surface and a layer of metal is disposed over the layer of dielectric material to mask or prevent the formation of electric fields in the vicinity of the device so that electrons and positive ions will not be attracted to the device.

Figure 1:
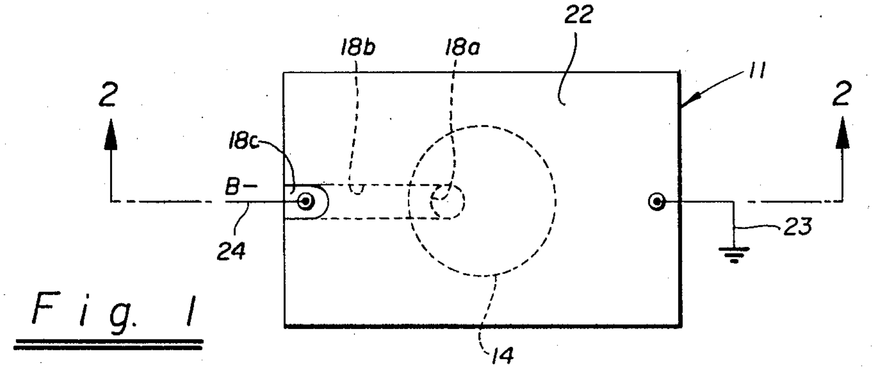
FIG. 1 is a greatly enlarged plan view of a semiconductor device incorporating the present invention.
Figure 2:
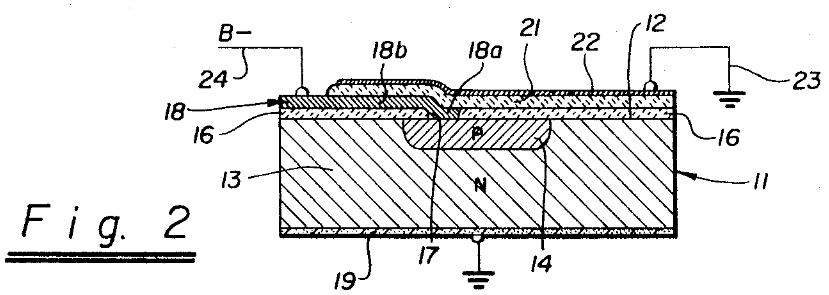
FIG. 2 is a cross-sectional view taken along the line 2—2 of FIG. 1.

More in particular, as shown in FIGS. 1 and 2, my semiconductor device consists of a body 11 of a suitable semiconductor material such as silicon which is formed with a surface 12 which, as shown in FIG. 2, may be planar. All of the body 11 or a substantial portion of the body 11 can be doped either during crystal growth or by diffusing either an n-type or a p-type dopant through one or more surfaces of the body 11 to provide a region 13 of one conductivity as, for example, an n-type conductivity as shown in FIG. 2.

An oxide layer 16 is formed at elevated temperatures in an oxidizing atmosphere on the surface 12 of the body 11. After the oxide layer 16 has been formed on the surface 12, an opening (not shown) is formed in the oxide layer by well known chemical etching techniques. Thereafter, a region of opposite conductivity is formed in the region of the one conductivity already formed by diffusing a p-type dopant through the exposed area of surface 12 into the region 13 to form a p-type layer or region 14. At the same time as, or subsequent to, the diffusion step, an oxide layer is regrown over the opening to provide an insulating layer 16 which extends over the entire surface 12. Thereafter, a hole 17 of closely controlled dimensions is etched into the oxide layer 16 by well known photoengraving techniques.

Electrical contact is made with at least two of the regions. Contact is made to the p-type region 14 in a suitable manner such as by evaporation of a layer of aluminum or other suitable metal over the entire exposed surface including the area exposed by the hole 17 and then removing the undesired portions of the metal layer by conventional photolithographic techniques. Thus, there is formed a contact and lead structure 18. This contact and lead structure 18 consists of a contact portion 18*a* disposed within the hole 17 and makes intimate contact with the p-type region 14, an elongate lead portion 18*b* which overlies the oxide insulating layer 16, and a portion 18*c* to which a lead is connected as hereinafter described. Contact is made to the n-type region 13 by making contact with the back surface of the body 11 with suitable means such as gold-silicon solder used to mount the device and which provides the layer 19. Alternatively, contact may be made through the front surface of the body by etching through the layer 16 and depositing a metal layer as hereinbefore described, to form a lead structure making contact with the n-type region 13.

This portion of the semiconductor structure so far described is substantially conventional. Thereafter, in order to make the semiconductor device resistant to ionization caused by radiation, an additional insulating layer 21 of a suitable dielectric, such as silicon dioxide, is formed over the entire surface of the semiconductor device on which the insulating layer 16 and the lead structure 18 is formed. The deposition of this additional layer 21 can be accomplished in a suitable manner such as by evaporation in a vacuum or by sputtering. Dielectric materials other than silicon dioxide, such as Pyrex, can be used. However, silicon oxide is a very suitable material because it is an excellent dielectric and it has a coefficient of expansion which is equal that of the layer 16. In view of the fact that the silicon dioxide has a very low dielectric constant, the capacitance which is introduced into the semiconductor device by the use of this additional layer is reduced to a minimum. When the layers 21 are very thick, they should be formed of a material having a coefficient of expansion close to that of the body 11.

After the deposition of the insulating layer 21 has been completed, a metal conducting layer 22 is deposited over the entire exposed surface of the insulating layer 21. Preferably, this metal layer 22 should be very thin so that it will have a very high sheet resistivity. This layer 22 can be deposited in any suitable manner such as by evaporation or sputtering.

Openings are formed in the layers 22 and 21 by conventional photolithographic techniques to expose an area 18*c* of the lead structure 18. A lead 23 is then bonded to the sheet or layer 22 by conventional thermocompression bonding techniques and is grounded as is the metal layer 19. An additional lead 24 is also connected to the lead structure 18 by thermocompression bonding techniques and is adapted to be connected to a suitable source of voltage as indicated. The openings formed in the layers 22 and 21 are sufficiently large so that there is no danger of a short circuit occurring between the layer 22 and the lead 24. In the construction shown in FIGS. 1 and 2, it will be noted that the electrical leads 23 and 24 are connected at points which are spaced a substantial distance away from the junctions between the two regions 13 and 14.

By way of example, the metal layer 22 can be formed of a suitable material such as gold having a thickness of 200–300 angstroms. The insulating layer 21 shoud be relatively thick in comparison and, by way of example, can have a thickness of several microns. In general, the thicker the insulating layer 21, the better the device because the parasitic capacitance between the device and the layer 22 is lower. The high resistivity of the layer 22 also reduces the effect of this parasitic capacitance.

In the event the gaseous atmosphere in which the semiconductor device is encapsulated is subjected to radiation which causes ionization of the gases and the formation of electrons and positive ions, such electrons and positive ions will not affect the semiconductor device because the metal layer or sheet 22 is at ground potential. The metal shield masks or neutralizes the fringing field by preventing the fringing field from extending beyond the metal layer or shield and into the gaseous atmosphere surrounding the device. For this reason, there is no tendency for the device to attract either the positive ions or the electrons and, therefore, there is no tendency for inversion layers to be formed on the surface 12 of the semiconductor device which could cause degradation of the semiconductor device. If electrons or positive ions by chance should come in contact with the metal layer 22, they will be bled off through the ground connection 23. Thus, it can be seen that the semiconductor device can be made very resistant to ionization caused by radiation merely by the addition of an additional insulating layer and depositing a metal layer on the insulating layer to eliminate any electric fields in the gaseous atmosphere in which the device is encapsulated or, in other words, to establish an equipotential space. The insulating layer is necessary in order to prevent the metal layer from shorting out the lead structures. In view of the fact that the metal layer 22 can be formed so that it overlies substantially all of the area of the surface 12, the metal layer 22 serves as a very effective means for rendering the semiconductor device resistant to ionization caused by radiation. Only very small openings need be provided in the metal layer 22 as, for example, as shown in FIG. 1, for the lead 24.

Figure 3:
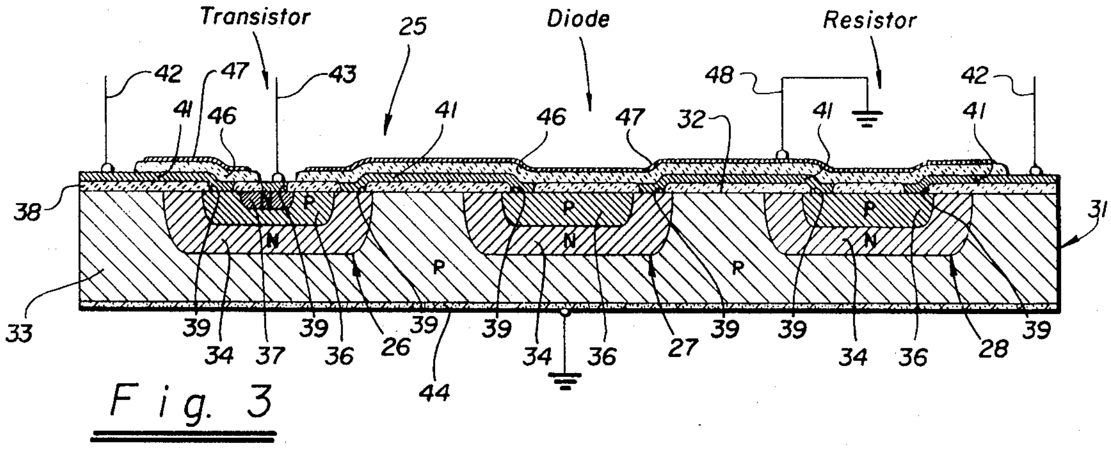
FIG. 3 is a greatly enlarged cross-sectional view of a plurality of semiconductor devices formed as an integrated circuit and also incorporating the present invention.

In FIG. 3, there is shown another semiconductor structure in the form of an integrated circuit 25 in which a plurality of semiconductor devices 26, 27 and 28 have been incorporated. These devices can be of any type such as a transistor, diode and resistor as shown. A substantially identical method and technique as hereinbefore described in conjunction with the semiconductor device shown in FIGS. 1 and 2 is utilized for forming the semiconductor structure shown in FIG. 3. Thus, a semiconductor body 31 of suitable material, such as silicon and having a planar surface 32, has a p-type dopant therein or subsequently diffused therein to provide a region 33 of a p-type or of one conductivity. Regions 34 of opposite conductivity, that is, n-type conductivity, are formed by diffusing n-type dopants through the surface 32 into the region 33. Thereafter masking and etching techniques as, for example, by the regrowing of an oxide layer and then etching openings therein and diffusing suitable dopants through the openings, regions 36 of p-type or of said one conductivity are formed within the n-type regions 34 to form junctions which extend to the surface 32. By suitable masking and etching techniques, another region 37 of n-type conductivity is formed within the p-type region 36 to form a junction which also extends to the surface 32.

After all of the regions have been diffused into the semiconductor body 31, an oxide layer 38 is formed on the surface 32. Thereafter, openings or holes 39 are etched into the insulating layer 38 by suitable means such as photoengraving techniques. A lead structure 41 is provided for making contact with at least one of the regions of each of the devices 26, 27 and 28. It is formed by evaporating a layer of suitable material such as aluminum over the entire surface and then removing the undesired portions by photolithographic techniques. The lead structure 41 makes contact with certain regions of the semiconductor devices as shown in FIG. 3. Additional lead structures is provided for making contact with the body of the semiconductor material 31 and consists of a layer 44 formed on the back side or on the side opposite the surface 32 of the semiconductor body 31 by use of suitable means such as a gold-silicon alloy which is used for mounting the integrated circuit. As shown, this layer 44 may be grounded. The portion of the integrated circuit thus far described is substantially conventional.

In order to make the integrated circuitry resistant to ionization caused by radiation, an insulating layer 46 of a suitable material such as silicon dioxide is deposited over the entire front or upper surface of the integrated circuitry. After a suitable insulating layer 46 has been deposited, a very thin metal layer 47 is deposited upon the insulating layer 46 in the same manner as hereinbefore described in conjunction with FIGS. 1 and 2. Thereafter holes are etched into the metal layer 47 and the insulating layer 46 in two separate etching steps in which the hole in the metal is formed first and the hole in the insulating layer is formed last. Leads 42 and 43 are bonded to the appropriate exposed areas. Lead 48 is bonded to the metal layer 47 which may then be grounded.

The metal layer 47 acts in the same way as the metal layer 22 in the embodiment shown in FIGS. 1 and 2 and serves to prevent the fringing fields extending above the metal layer 47 into the gaseous environment surrounding the integrated circuitry. Thus, the metal layer 47 prevents the formation of inversion layers on the surface 32 when the device is subjected to radiation.

In order to still further reduce the effects of radiation, the semiconductor devices herein disclsed can be mounted ing glass packages of the type described in copending application, Ser. No. 329,190, filed Dec. 9, 1963, now Pat. No. 3,271,625. These flat glass packages make it possible to reduce the encapsulated gaseous atmosphere so that it is very small. Since the quantity of air which is encapsulated is relatively small, the number of ions and electrons formed is also substantially less than would be the case if the semiconductor device were packaged in a conventional package, as for example, a TO–5 can. Also, by the elimination of the metal enclosure, the formation of a field between the metal enclosure and the semiconductor device is eliminated. However, it should be pointed out that even if a metal package is used, the construction herein disclosed is still very effective because normally the metal package as well as the metal layer on the device is grounded so that there is no electric field within the metal package to thereby provide an equipotential space in the vicinity of the device which does not cause electrons or positive ions to be attracted to the device.

It is apparent from the foregoing that I have provided a new and improved semiconductor device which is particularly resistant to ionization created by radiation. In addition, the construction of the semiconductor device is relatively simple and inexpensive. Although the drawings disclosed planar type semiconductor devices devices, the present invention is applicable to other types of semiconductor devices, such as mesa type devices. With mesa type devices an insulating layer and a metal layer would be deposited over the surfaces of the device in which inversion layers could form in the same manner as with planar type devices.

I claim:

1. A semiconductor device, comprising:

(a) at least one active circuit component at one principal surface of a substrate having two principal surfaces thereof, said at least one active circuit component being comprised of at least two regions of opposite conductivity type semiconductor material with a P-N junction therebetween, (b) ohmic contacts to each of said at least two regions of opposite conductivity type semiconductor material, (c) a continuous layer of insulating material overlying said at least one active circuit component and said ohmic contacts, (d) a first deposited metallized film integral with and substantially covering the entire top surface of said continuous layer of insulating material, and (e) a second deposited metallized film integral with and substantially covering the other of said principal surfaces of said substrate, (f) said first and second metallized films being maintained at substantially the same potential.

2. The semiconductor device as described in claim 1 wherein said first and second metallized films are ohmically connected.

3. An integrated circuit device, comprising: a plurality of circuit components at one principal surface of a substrate having two principal surfaces thereof, ohmic conductors interconnecting selected ones of said plurality of circuit components, a continuous layer of insulating material overlying said plurality of active circuit components and said ohmic conductors, a pair of ground planes substantially parallel to said two principal surfaces and vertically spaced from said plurality of circuit components, one of said ground planes comprising a deposited metallized film integral with and substantially covering the entire top surface of said continuous layer of insulating material, the other of said ground planes comprising a second deposited metallized film integral with and substantially covering the other of said two principal surfaces of said substrate, said first and second metallized films being maintained at substantially the same potential.

4. In a semiconductor device, a semiconductor body having a surface, said body containing a first region of one conductivity type, a second region of opposite conductivity type disposed in said region of one conductivity type forming a junction which extends to the surface, contact means secured to said first and second regions, a layer of insulating material disposed over said surface and over a substantial portion of said contact means and a layer of metal disposed over the layer of insulating material and overlying said regions.

5. A semiconductor device as in claim 4 wherein the thickness of said metal layer is relatively thin in comparison to the thickness of said insulating layer.

6. A semiconductor device as in claim 4 together with an additional layer of insulating material, said contact means overlying said additional layer of insulating material, said first named layer of insulating material overlying said contact means.

7. A semiconductor device as in claim 4 together with means for grounding said metal layer.

8. A semiconductive device as in claim 6 together with at least one hole formed in said additional layer of metal and said additional layer of insulating material to expose a portion of said contact means, and a lead bonded to the exposed portion of said contact means.

9. A semiconductive device as in claim 8 wherein the hole formed in said layer of metal is larger than the hole formed in said layer of insulating material.

10. In a semiconductor device, a semiconductor body having a surface, said body containing a region of one conductivity type, a region of opposite conductivtiy type disposed in said region of one conductivity type and forming a junction which extends to the surface, a layer of insulating material overlying said surface, said layer of insulating material having at least one opening in registration with at least one of said regions, a lead structure disposed in said opening and overlying said insulating layer, and additional insulating layer overlying said first named insulating layer and said lead structure, and a metal layer of high sheet resistivity overlying said additional insulating layer.

11. A device as in claim 10 wherein said metal layer overlies substantially all of the surface of the semiconductor body.

12. A semiconductor device as in claim 10 wherein said additional insulating layer has a thickness substantially greater than the thickness of the metal layer.

13. A semiconductor device as in claim 12 in which the metal layer has a thickness of 200–1000 angstroms.

14. A semiconductive device as in claim 10 wherein at least one opening is formed on the metal layer and the additional insulating layer to expose a portion of the lead structure.

References Cited

UNITED STATES PATENTS

| | | | |
|---|---|---|---|
| 3,158,788 | 11/1964 | Last | 317—101 |
| 3,205,295 | 9/1965 | Davidson | 174—32 |

ROBERT K. SCHAEFER, Primary Examiner

J. R. SCOTT, Assistant Examiner

U.S. Cl. X.R.

29—577; 317—234